(12) United States Patent
Walter

(10) Patent No.: US 7,616,443 B2
(45) Date of Patent: Nov. 10, 2009

(54) COOLING DEVICE FOR ELECTRICAL POWER UNITS OF ELECTRICALLY OPERATED VEHICLES

(75) Inventor: Alexander Walter, Augsburg (DE)

(73) Assignee: RENK Aktiengesellschaft, Augsburg (DE)

( * ) Notice: Subject to any disclaimer, the term of this patent is extended or adjusted under 35 U.S.C. 154(b) by 138 days.

(21) Appl. No.: 10/581,426

(22) PCT Filed: Dec. 5, 2003

(86) PCT No.: PCT/EP03/13797

§ 371 (c)(1),
(2), (4) Date: Aug. 16, 2006

(87) PCT Pub. No.: WO2005/055687

PCT Pub. Date: Jun. 16, 2005

(65) Prior Publication Data

US 2007/0051490 A1   Mar. 8, 2007

(51) Int. Cl.
*H05K 7/20* (2006.01)
*B60H 1/00* (2006.01)
*H01L 23/34* (2006.01)
*B60K 1/00* (2006.01)
*H02P 1/00* (2006.01)

(52) U.S. Cl. .................. 361/699; 165/41; 165/80.4; 165/80.5; 257/714; 257/252; 180/65.1; 318/139; 318/472

(58) Field of Classification Search .............. 361/696, 361/698, 699; 165/41, 121, 80.4–80.5; 257/714; 174/15.1, 252; 180/68.2, 68.1, 65.1, 65.3; 37/10.1
See application file for complete search history.

(56) References Cited

U.S. PATENT DOCUMENTS

| 4,998,591 | A | | 3/1991 | Zaunberger |
| 5,349,498 | A | * | 9/1994 | Tanzer et al. ................. 361/689 |
| 5,966,291 | A | * | 10/1999 | Baumel et al. ............... 361/707 |
| 6,323,613 | B1 | * | 11/2001 | Hara et al. .................. 318/471 |
| 6,326,761 | B1 | * | 12/2001 | Tareilus ...................... 318/722 |
| 6,442,023 | B2 | * | 8/2002 | Cettour-Rose et al. ...... 361/690 |
| 6,450,275 | B1 | * | 9/2002 | Gabriel et al. ............. 180/65.4 |

(Continued)

FOREIGN PATENT DOCUMENTS

DE     27 57 282     7/1979

(Continued)

OTHER PUBLICATIONS

Search Report dated Jul. 23, 2004 issued for the corresponding International Application No. PCT/EP2003/013797.

*Primary Examiner*—Jayprakash N Gandhi
*Assistant Examiner*—Zachary M Pape
(74) *Attorney, Agent, or Firm*—Cohen Pontani Lieberman & Pavane LLP

(57) ABSTRACT

A cooling device for an electrical power unit of electrically operated vehicles, comprising at least one power section and at least one control section. A first cooling circuit containing a heat exchanger with a low coolant temperature is provided mainly for cooling elements of the control sections, and a further cooling circuit with a higher coolant temperature is provided mainly for cooling elements of the power sections.

9 Claims, 1 Drawing Sheet

U.S. PATENT DOCUMENTS

| | | | |
|---|---|---|---|
| 6,651,761 B1 * | 11/2003 | Hrovat et al. | 180/65.3 |
| 6,661,659 B2 * | 12/2003 | Tamba et al. | 361/699 |
| 6,909,607 B2 * | 6/2005 | Radosevich et al. | 361/699 |
| 2003/0133267 A1 | 7/2003 | Kaishian et al. | |
| 2006/0118066 A1 * | 6/2006 | Martins | 123/41.08 |

FOREIGN PATENT DOCUMENTS

| | | |
|---|---|---|
| DE | 44 36 547 | 4/1996 |
| EP | 1 060 941 | 12/2000 |
| EP | 1 253 814 | 10/2002 |

* cited by examiner

COOLING DEVICE FOR ELECTRICAL POWER UNITS OF ELECTRICALLY OPERATED VEHICLES

CROSS-REFERENCE TO RELATED APPLICATIONS

This is a US national stage of application No. PCT/EP2003/013797, filed on 5 Dec. 2003.

BACKGROUND OF THE INVENTION

1. Field of the Invention

The invention relates to a cooling device for electrical power units of electrically operated vehicles, wherein the power unit has a power section and a control section.

2. Description of the Related Art

It is generally known to equip vehicles with electrical traction drives. DE 37 28 171 C2 U.S. Pat. No. 4,998,591 discloses, for example, an electromechanical drive system for a full-track vehicle. At least one electric traction motor and an electric steering motor are provided and can be used to mechanically transmit the regenerative steering power from one drive side to the other.

EP 1 060 941 B1 discloses a device for controlling and operating an electrical vehicle drive. In this drive arrangement, each drive side is provided with its own electric drive motor.

In order to supply electrical power to the electric motors for driving such vehicles, current generators—which are driven by internal combustion engines—are generally provided. The electrical power is transmitted to the electric motors via corresponding power units. Such power units comprise a power section and a control section which are combined to form a compact physical unit. Depending on the transmitted power, the power units heat up and have to be cooled in order to protect their components from overheating. Powers which are transmitted in the power sections are 1 to 4 powers of ten ($10$ to $10^4$) greater than in the control sections.

The single loop cooling systems used have to be designed for the lower maximum permissible temperatures of the control electronics. Therefore, large heat exchangers containing correspondingly large amounts of coolant are required in order to be able to dissipate the large amount of heat which is produced in the power sections using the low cooling power of such a low temperature cooling arrangement.

SUMMARY OF THE INVENTION

On this basis, the object of the invention is to provide a cooling system which can be used to sufficiently cool both the control section and the power section and which makes it possible to use smaller heat exchangers.

According to the invention, a first cooling circuit is arranged primarily for cooling the control section, and a second cooling circuit is arranged primarily for cooling the power section. The second cooling circuit is designed and arranged to feed coolant at a higher temperature than the first cooling circuit.

It is advantageously possible to use smaller heat exchangers by dividing the cooling system into a low-power, low temperature cooling circuit for the control electronics and a high power, high temperature cooling circuit for power electronics, as suggested by the invention.

The cooling system according to the invention is particularly advantageous for electrically operated vehicles since it contributes to reducing the overall weight of the drive system.

BRIEF DESCRIPTION OF THE DRAWING

The sole FIGURE is a block diagram of a cooling device according to the invention.

DETAILED DESCRIPTION OF THE PRESENTLY PREFERRED EMBODIMENTS

Figure 1:
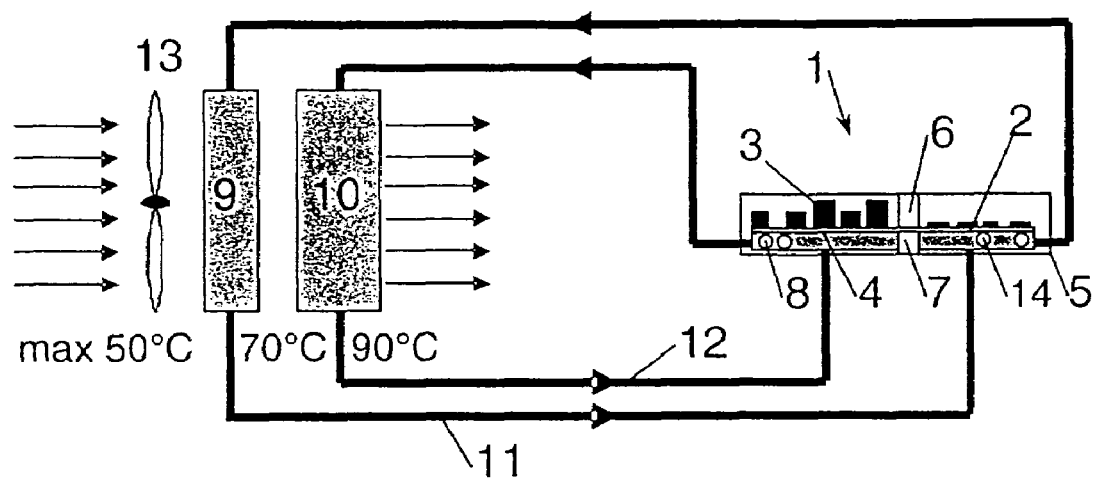

The FIGURE illustrates an electrical power unit 1 for supplying power to an electric motor for an electrically operated vehicle. Since the present invention relates to cooling such a power unit 1, the electrical cabling to an energy source and the associated electric motor, and the signal lines between and the power unit 1 operator control devices of the vehicle, such as the accelerator pedal, steering device and the like, are not illustrated.

The power unit 1 which is illustrated by way of example is arranged on a printed circuit board 4 in a housing 5. The power unit 1 which, in a known manner, comprises a control section 2 and a power section 3 is preferably arranged on the printed circuit board 4 in such a way that the electronic components which belong to the control section 2 and the power section 3 take up a respective region on the printed circuit board 4.

A first cooling circuit 11 containing a heat exchanger 9 is provided for the control section 2 and a further cooling circuit 12 containing a heat exchanger 10 is provided for the power section 3. The heat exchangers 9, 10 are designed for extreme ambient conditions with ambient temperatures of approximately 50 degrees Celsius (122 degrees F.). On this basis, the heat exchanger 9 can be designed in such a way that a feed temperature of approximately 70 degrees Celsius (158 degrees F.) is provided for the more sensitive components of the control section 2.

A higher feed temperature of approximately 90 degrees Celsius (194 degrees F.) is permissible for the power section 3 which converts a multiple of the power converted by the control section 2. On account of the physical relationship in which the flow of heat is proportional to the product of the volumetric flow and the temperature difference of the coolant, the heat exchanger 10 with the higher temperature has a greater cooling power. The heat exchanger 10 can therefore be designed to be smaller than a heat exchanger with a lower temperature, while maintaining the cooling power.

On account of the higher cooling power of the second heat exchanger 10 for the power section 3 and the amount of heat which is small in relation to the power section and has to be conducted away from the control section 2, the two heat exchangers 9, 10 together are physically smaller than an individual heat exchanger which would have to cool both sections of the power unit at the lower temperature.

The two heat exchangers 9, 10 are preferably arranged in series and a fan 13 can additionally be provided in order to back up the cooling power.

It is particularly advantageous to provide partition walls 6, 7 between the power section 3 and the control section 2, these partition walls extending as far as the common printed circuit board 4 and dividing the housing 5 into two regions which are closed off from one another. The partition walls 6, 7 are preferably produced from a thermally insulating material.

Cooling ducts 8, 14 for conducting the coolant can be provided in the housing 5 and on the partition walls 6, 7 for the different cooling circuits 11, 12.

Instead of producing the power unit 1 as a compact assembly, it is also feasible for the power section 3 and the control section 2 to be arranged such that they are physically separate from one another.

In general, the components of the power section generate a large amount of waste heat but can also withstand high ambient temperatures, whereas the components of the control section generate less waste heat but can only withstand a lower ambient temperature. In the case of exceptions from this rule, it is also entirely possible to place elements which are typical of the power section in the region of the control section if these generate a small amount of waste heat or only withstand relatively low ambient temperatures. It is equally possible to place components which are typical of the control section in the power section if these withstand high ambient temperatures. It may also be advantageous to break up the independent assemblies of the power section and the control section as such, and form new assemblies whose elements are combined according to generation of and sensitivity to heat.

The important core feature of the invention can be seen in providing two separate cooling circuits for cooling an electrical power unit of electrically operated vehicles, and cooling the components of the power section which are subject to a higher temperature using a more powerful high temperature cooling circuit. On account of the improved cooling power of the high temperature cooling circuit, a more compact heat exchanger can be provided for the significantly larger amount of heat which mainly has to be dissipated from the power section. A relatively small heat exchanger with a lower coolant temperature can also be provided for the relatively small amounts of heat from the control section. The overall result is therefore an advantageous reduction in the size of the cooling system compared to a single heat exchanger which has to cool both the power section and the control section with a low temperature.

The reduction in size of the cooling system results in smaller heat exchange areas and smaller amounts of coolant.

What is claimed is:

1. A cooling system for an electrical power unit of an electrically operated vehicle, said power unit comprising at least one power section and at least one control section, said cooling system comprising:
   a first cooling circuit arranged to primarily cool said at least one control section, said first cooling circuit comprising a first heat exchanger configured and arranged to feed coolant to said at least one control section at a first coolant temperature;
   a second cooling circuit arranged to primarily cool said at least one power section, said second cooling circuit comprising a second heat exchanger configured and arranged to feed coolant to said at least one power section at a second coolant temperature which is higher than said first coolant temperature; and
   at least one partition wall arranged between said at least one power section and said at least one control section;
   wherein said at least one power section and said at least one control section are arranged on a common printed circuit board in a common housing.

2. The cooling system of claim 1 wherein said first heat exchanger is configured and arranged to feed coolant to said at least one control section at a coolant temperature of approximately 70° C., and said second heat exchanger is configured and arranged to feed coolant to said at least one power section at a coolant temperature of approximately 90° C.

3. The cooling system of claim 1 wherein said second heat exchanger is arranged serially downstream of said first heat exchanger with respect to a direction of air flow toward said first heat exchanger.

4. The cooling system of claim 3 further comprising a fan, said first heat exchanger being arranged serially downstream of said fan.

5. An electrical power system for an electrically operated vehicle, said power system comprising:
   a power unit comprising at least one power section and at least one control section;
   a first cooling circuit arranged to primarily cool said at least one control section, said first cooling circuit comprising a first heat exchanger configured and arranged to feed coolant to said at least one control section at a first coolant temperature;
   a second cooling circuit arranged to primarily cool said at least one power section, said second cooling circuit comprising a second heat exchanger configured and arranged to feed coolant to said at least one power section at a second coolant temperature which is higher than said first coolant temperature; and
   at least one partition wall arranged between said at least one power section and said at least one control section;
   wherein said at least one power section and said at least one control section are arranged on a common printed circuit board in a common housing.

6. The cooling system of claim 5 wherein said at least one partition wall is made of thermally insulating material.

7. The cooling system of claim 5 wherein said at least one power section and said at least one control section are spatially separate from one another.

8. The power system of claim 5 wherein said control section comprises elements which are arranged in a region of said at least one power section.

9. The power system of claim 5 wherein said at least one power section comprises elements which are arranged in a region of said at least one control section.

* * * * *